(12) United States Patent
Chan (10) Patent No.: US 6,353,346 B1
(45) Date of Patent: Mar. 5, 2002

(54) APPARATUS AND METHOD FOR A PROGRAMMABLE ADAPTIVE OUTPUT DRIVER

(75) Inventor: Wai Cheong Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/684,754

(22) Filed: Oct. 6, 2000

(51) Int. Cl.$^7$ ................................................ H03B 1/00
(52) U.S. Cl. ........................ 327/112; 327/206; 327/170
(58) Field of Search ................................ 327/108, 112, 327/205, 206, 170, 134, 264, 276, 277, 278; 326/86, 87

(56) References Cited

U.S. PATENT DOCUMENTS

| | | | | |
|---|---|---|---|---|
| 4,539,489 A | | 9/1985 | Vaughn | 327/206 |
| 5,336,942 A | * | 8/1994 | Khayat | 327/206 |
| 5,632,019 A | | 5/1997 | Masiewicz | 395/250 |
| 5,654,645 A | * | 8/1997 | Lotfi | 327/206 |
| 5,874,844 A | * | 2/1999 | Shin | 327/206 |
| 5,945,859 A | * | 8/1999 | Pang | 327/206 |
| 6,037,810 A | | 3/2000 | Woodward | 327/108 |
| 6,229,350 B1 | * | 5/2001 | Ricon-Mora | 327/206 |

OTHER PUBLICATIONS

A Low Power–Noise Output Driver with an Adaptive Characteristic Applicable to a Wide Range of Loading Conditions,; C.S. Choy, M.H. Ku, and C.F. Chan; IEEE Journal of Solid–State Circuits, vol. 32, No. 6, pp. 913–917, Jun. 1997.

* cited by examiner

Primary Examiner—Tuan T. Lam
Assistant Examiner—An T. Luu
(74) Attorney, Agent, or Firm—Merchant & Gould P.C.; John W. Branch (57) ABSTRACT

An adaptive output driver that uses a programmable Schmitt-trigger buffer to change the driver's operational response after it is manufactured. The adaptive output driver includes a primary driver that provides the primary current to drive an output signal into a load. A secondary driver for the adaptive output driver is enabled by the Schmitt-trigger buffer to provide an additional current to drive the load when the transitions between high and low states are slower than a predetermined slew rate. The programmable Schmitt-trigger buffer includes cells of pull-up and pull-down transistors that can be separately enabled. Each enabled cell causes an imbalance in the overall sizing ratio of activated pull-up and pull-down transistors; the amount of imbalance in the overall sizing ratio corresponds to the amount of hysteresis in the response of the Schmitt-trigger buffer. By programming the amount of hysteresis in the Schmitt-trigger buffer, the operation of the adaptive output driver can be modified to suit different loading conditions after manufacture. The programmable Schmitt-trigger buffer can be used in the input stage of an input/output driver employed with a microprocessor. Also, the programmable Schmitt-trigger buffer may be used with a distributed and weighted output driver to provide separate delays in the operation of selected output stages.

18 Claims, 8 Drawing Sheets

FIG. 1

10 - Programmable Output Driver
12 - Inverter
14 - Primary Driver
16 - Control Circuit
18 - Secondary Driver
20 - Programmable Schmitt Trigger Buffer
32 - Control Lines
36 - Logic Decoder
38 - Logic Lines

| Control Bits | A | B | C | D |
|---|---|---|---|---|
| 00 | 1 | 0 | 0 | 0 |
| 01 | 1 | 1 | 0 | 0 |
| 10 | 1 | 1 | 1 | 0 |
| 11 | 1 | 1 | 1 | 1 |

FIG. 4

| Control Bits | # of Pull_down | # of Pull_up |
|---|---|---|
| 00 | | |
| Rising | 0 | 1 |
| Falling | 1 | 0 |
| 01 | | |
| Rising | 0 | 2 |
| Falling | 2 | 0 |
| 10 | | |
| Rising | 0 | 3 |
| Falling | 3 | 0 |
| 11 | | |
| Rising | 0 | 4 |
| Falling | 4 | 0 |

APPARATUS AND METHOD FOR A PROGRAMMABLE ADAPTIVE OUTPUT DRIVER

FIELD OF THE INVENTION

The present invention relates to output drivers and, more particularly, to a programmable adaptive output driver for use in integrated circuits.

BACKGROUND INFORMATION

An integrated circuit (IC) is usually constructed from a small chip of semiconductor material upon which an array of active/passive components have been constructed and connected together to form a functioning circuit. An IC is generally encapsulated in a plastic housing (chip) with signal, power supply, and control pins accessible for connection to external electronic circuitry. Typically, input signals transmitted to an integrated circuit via selected input pins are processed by the array of active/passive components, and the processed signals are then applied to selected output pins using an output driver. The output driver "pulls-up" or "pulls-down" a voltage level of the output in response to the signals generated by the array of components, thereby providing logic "1" and "0" signals which are transmitted to the external circuitry connected to the output.

A typical output driver includes a CMOS inverter with a p-channel pull-up transistor and an n-channel pull-down transistor. The n-channel and p-channel transistors in the CMOS inverter are often designed to supply enough current to a large load while the output swings between the rails of the power supply at a relatively high frequency. Also, circuitry external to the IC is usually employed to couple output drivers to a load condition.

Output drivers can be used to drive a signal onto a bus line that has a relatively large load. Output drivers are often designed and simulated to meet specific application requirements such as load size, as well as speed and/or noise compensation. Typically, output drivers are designed to quickly drive signals under expected load conditions, but at the same time, not too quickly so as to cause excessive noise problems. Additionally, a particular application of an output driver may be limited to a maximum slew rate so as to minimize undesirable high frequency components of the output signal and reduce unwanted radiation.

When the real world performance of an output driver for an IC did not satisfy specification requirements, complete redesign of the output driver was often necessary. Historically, the trip point of an output driver was not adjustable after the IC was manufactured and the driver could not be readily modified to compensate for a greater and/or different range of actual loading conditions. Since an IC with non-conforming output performance is usually unfit for its intended purpose, it will be appreciated that enabling the performance of an output driver to be tuned to meet specification requirements after the IC is reduced to silicon would reduce delays and costs associated with redesigning an output driver for an IC manufactured for a particular use.

SUMMARY

In accordance with the invention, the strength of an output signal to drive a load can be adjusted after an adaptive output driver is manufactured. The adaptive output driver includes a primary driver and a secondary driver. The primary driver provides a primary current for driving the output signal into the load. A control circuit enables the secondary driver to assist the primary driver by providing an additional current that is added to the primary current to drive the output signal into the load when transition times between high and low states for the output signal are slower than a maximum slew rate. A buffer for disabling the operation of the secondary driver, wherein a trip point for the buffer to disable the secondary driver is programmable so that the total amount of current provided by the output driver to drive the output signal into the load is adaptable to different loading conditions.

In accordance with other aspects of the invention, the buffer includes at least one cell of at least two pull-up transistors and at least two pull-down transistors. Hysteresis in the response of the buffer is related to an imbalance in the sizing ratio of each pull-up transistor and each pull-down transistor in each enabled cell. Also, the hysteresis defines the value for the trip point where the buffer disables the operation of the secondary driver.

In accordance with still other aspects of the invention, a logic circuit is coupled to the buffer and provides for selectively enabling one or more cells so that a position for the buffer's trip point is adjustable for different loading conditions. The pull-up transistors and pull-down transistors can be CMOS transistors. Also, the buffer may be a Schmitt-trigger buffer.

In accordance with yet other aspects of the invention, the control circuit employs a single transistor to negate a logical state for each logic gate included in the control circuit so that the response time for the control circuit is reduced. The control circuit can also provide short circuit protection and employ feedback to monitor the slew rate of the transitions between the high and low states of the output signal. Also, the trip point of the buffer includes a low trip point for transitions from the high state to the low state of the output signal and a high trip point for transitions from the low state to the high state of the output signal.

In accordance with one embodiment of the invention, programmable Schmitt-trigger buffers provide separate delays in output stages of a distributed and weighted output driver. Each output stage includes an inverter that can be separately controlled by the output of a corresponding Schmitt-trigger buffer. A logic circuit enables the programming of a separate time delay for the activation of each buffer so that the amount of current to drive the output signal into a load is ramped up over time.

In accordance with another embodiment of the invention, a programmable Schmitt-trigger buffer is employed in an input stage of an input/output driver to delay when an input signal is provided to a integrated circuit. The input/output driver includes a tri-state buffer for the driver's output stage to drive an output signal into an output load. A logic circuit enables the operation of the Schmitt-trigger buffer to be adjusted for different input signal conditions.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The invention enables the performance of an adaptive output driver to be modified after an IC is manufactured. In one embodiment, the adaptive output driver includes a primary driver, secondary driver, programmable Schmitt-trigger buffer, control circuit and logic circuit. By monitoring the slew rate (transition time between the low and high states under loaded and unloaded conditions) of the adaptive output driver's output signal through a feedback path, the adaptive output driver disables the secondary driver under light loads and activates the secondary driver to boost the strength of the output signal provided by the primary driver when necessary to drive higher loading conditions.

For example, when the slew rate of the output drive signal with the primary driver alone is fast enough to properly drive a load for a particular application, the Schmitt-trigger buffer will deactivate the secondary driver to prevent overdriving of the load. In this case, only the primary driver drives the load condition and a relatively low switching noise is achieved. Alternatively, when the slew rate of the output drive signal for a load condition is determined to be slower than specified for a particular application, the Schmitt-trigger buffer will not disable the activation of the secondary driver. In this case, the secondary driver will help the primary driver meet the specified requirements of an application by providing a boost to the strength of the output signal driving the load condition.

In one embodiment discussed below, a two-bit control circuit is used to program four different levels of hysteresis for a Schmitt-trigger buffer so that the trip points for triggering the operation of the Schmitt-trigger buffer and subsequent disablement/enablement of the secondary driver can be selected. The Schmitt-trigger buffer includes different sized Metal Oxide Semiconductor (MOS) transistors arranged in multiple "cells" ; and control lines from the control circuit disable/enable the operation of different transistor cells in the Schmitt-trigger buffer. Depending on the number of pull-up and pull-down MOS transistors that are enabled in the Schmitt-trigger buffer and their different sizes, the overall sizing ratio imbalance between the transistors may be programmed. As discussed below, the high and low trip points for activation of the Schmitt-trigger buffer is related to an imbalance in the overall sizing ratio of transistors enabled in the buffer. Thus, the invention enables "post-silicon" tuning of the performance of an adaptive output driver in an IC by enabling/disabling transistor "cells" in a Schmitt-trigger buffer.

Figure 1:
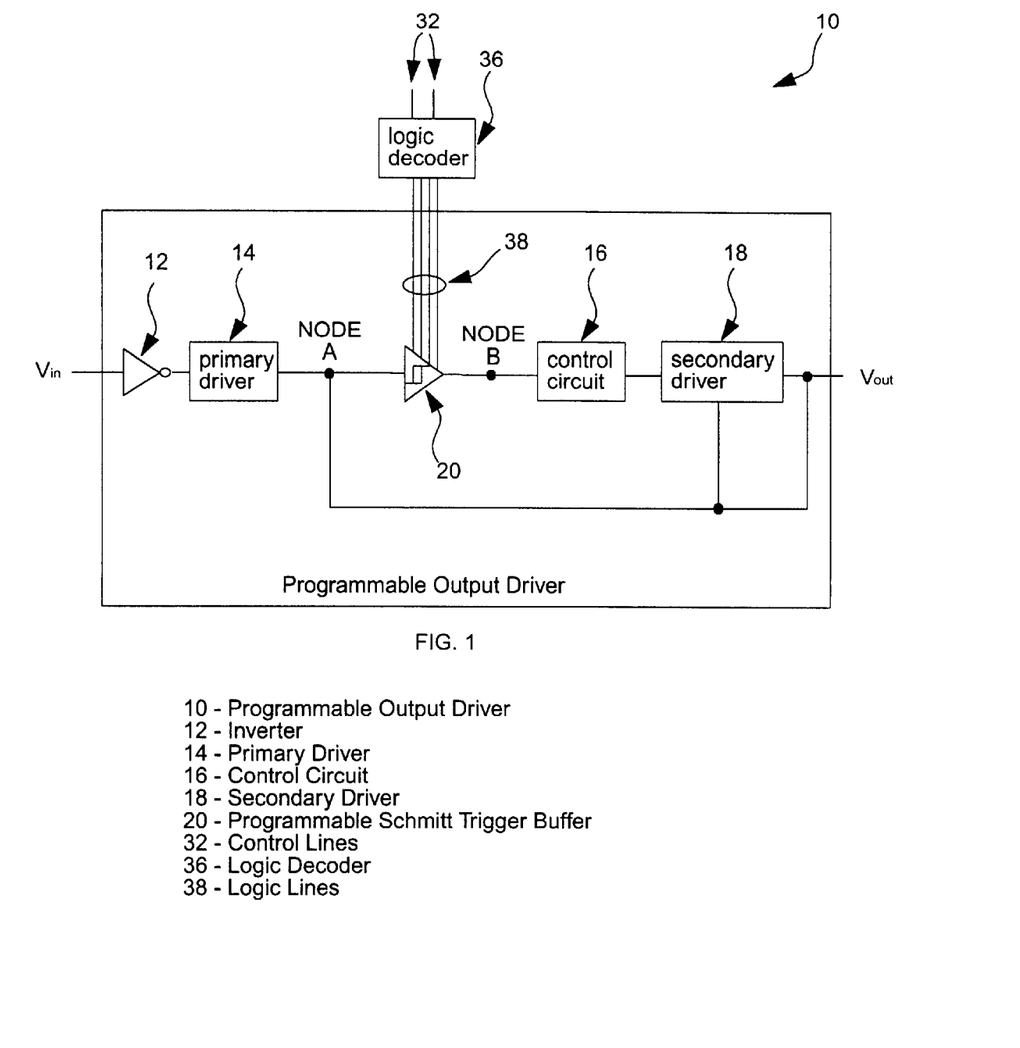
FIG. 1 illustrates a block diagram of a programmable adaptive output driver.

FIG. 1 illustrates a programmable adaptive output driver 10 that includes an inverter 12, a primary driver 14, a control circuit 16, a secondary driver 18, a programmable Schmitt-trigger buffer 20, and a logic decoder 36. The inverter 12 is coupled to an input signal ($V_{in}$) and the primary driver 14. The primary driver 14 is coupled at Node A to an input of the Schmitt-trigger buffer 20 and the secondary driver 18. A component of the output signal ($V_{out}$) is provided at Node A. The logic decoder 36 includes logic lines 38 which are coupled to the Schmitt-trigger buffer 20 and an output of the buffer is coupled at Node B to the control circuit 16. An output of the control circuit 16 is coupled to an input of the secondary driver 18 and an output of the secondary driver provides another component of the output signal $V_{out}$.

In the exemplary embodiment, the primary driver 14 drives the output signal under all load conditions; and the secondary driver 18 is employed to assist the primary driver 14 under high load conditions when the primary drive alone is unable to drive the load. Preferably, the primary driver 14 and secondary driver 18 include transistors with low power to noise characteristics. Also, the "trip point", or delay before the programmable Schmitt-trigger buffer 20 is triggered and disables the operation of the secondary driver 19 to boost the output signal, can be changed by enabling/disabling transistor cells in the buffer.

The logic decoder 36 is employed to enable MOS transistor cells in the programmable Schmitt-trigger buffer 20. In one embodiment, the logic decoder 36 employs a 2-to-4 bit decoding mechanism to enable MOS transistor cells within the programmable Schmitt-trigger buffer 20. The logic decoder 36 is controlled by two control lines 32 and provides an output on four logic lines 38A–D. The four logic lines 38A–D correspond to the number of MOS transistor cells within the exemplary Schmitt-trigger buffer 20 that can be enabled or disabled.

When the programmable output driver 10 receives an input signal $V_{in}$, it provides a related output signal $V_{out}$ as a function of the input signal $V_{in}$. In one embodiment, the output signal $V_{out}$ can have the same logic value as the input signal $V_{in}$ and in another embodiment the output signal may be an inverted representation of the input signal $V_{in}$.

Inverter 12, placed before the primary driver 14, can operate as a pre-driver stage that inverts the input signal $V_{in}$ before propagating it to the rest of the circuit. In a light loading condition, the primary driver 14 is activated to drive the output load and the secondary driver 18 is inactive. Alternatively, when a heavy load condition exists, both the primary driver 14 and the secondary driver 18 are active so that the secondary driver can assist the primary driver 14 in driving a heavy load on the output signal $V_{out}$. This adaptive operation is controlled by the control circuit 16, which continuously monitors the slew rate of the output signal $V_{out}$.

When the control circuit 16 determines that the output load is satisfactorily driven, i.e., the amount of slew is small (indicating a relatively light load condition and fast signal transitions), the programmable Schmitt-trigger buffer 20 will almost immediately trigger to disable the control circuit 16 and deactivate the secondary driver 18. Alternatively, when the control circuit 16 determines that the slew is large (indicating a large load condition and slow signal transitions), the Schmitt-trigger buffer 20 will not trigger right away and the secondary driver 18 will remain active and assist the primary driver in driving the output load condition. In one embodiment, the control circuit 16 enables a feedback mechanism and prevents a short circuit state.

Usually, the threshold voltages for both high and low triggering of the Schmitt-trigger buffer (high and low trip points) are fixed by design. However, through adjusting the Schmitt-trigger buffer's threshold voltages, the high and low trip points for triggering the activation of the buffer can be programmed after manufacture. An integrated circuit using the invention enables post-manufacture adjustment of the adaptive output driver response to drive actual output load conditions.

Figure 2:
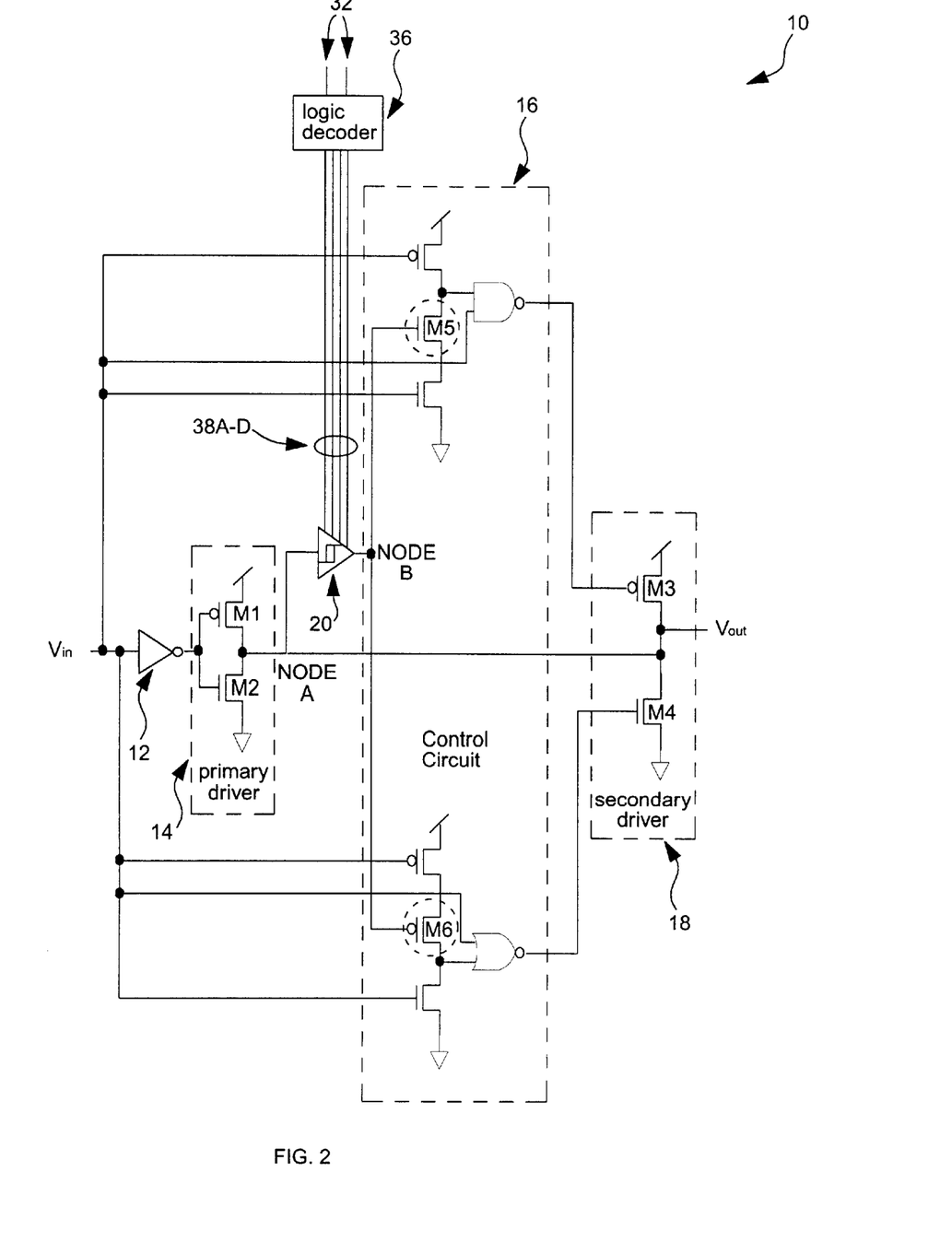
FIG. 2 shows a schematic diagram of a programmable adaptive output driver.

FIG. 2 illustrates a schematic diagram of one embodiment of the programmable adaptive output driver 10. The primary driver 14 and the secondary driver 18 include separate pairs of pull-up and pull-down MOS transistors M1, M2 and M3, M4, respectively. Both drivers' pair of MOS transistors are modeled as inverters that are connected in parallel. The primary and secondary driver's pull-up and pull-down MOS transistors operate to either pull-up or pull-down the output signal voltage $V_{out}$ in response to the "high" or "low" values of the input signal $V_i$.

The primary driver 14 drives the output signal under all load conditions and slew rates. However, for fast slew rates (light loads) the Schmitt-trigger buffer will activate quickly and disable the secondary driver 18 from boosting the output signal.

Alternatively, when the slew rate is slow (large loads) the activation of the Schmitttrigger buffer is delayed and the secondary driver 18 remains enabled to help boost the output signal provided by the primary driver 14.

The control circuit 16 includes a feedback mechanism and helps to prevent a short circuit state in the programmable output driver 10. The response time of the control circuit 16 is further reduced by the use of a single transistor to negate the value of each logic gate in the circuit. A transistor M5 is employed to negate the logic of a NAND logic gate and a MOS transistor M6 is used to negate the logic of a NOR logic gate in the control circuit 16. It is understood that the same functions of the control circuit 16 can be achieved by using other logic gates in other configurations to accomplish substantially the same result with a relatively short response time. Additionally, the logic decoder 36 is coupled to two control lines 32 that are used to set the state of four logic lines 38A–D for enabling/disabling transistor cells within the Schmitt-trigger buffer 20.

Figure 3:
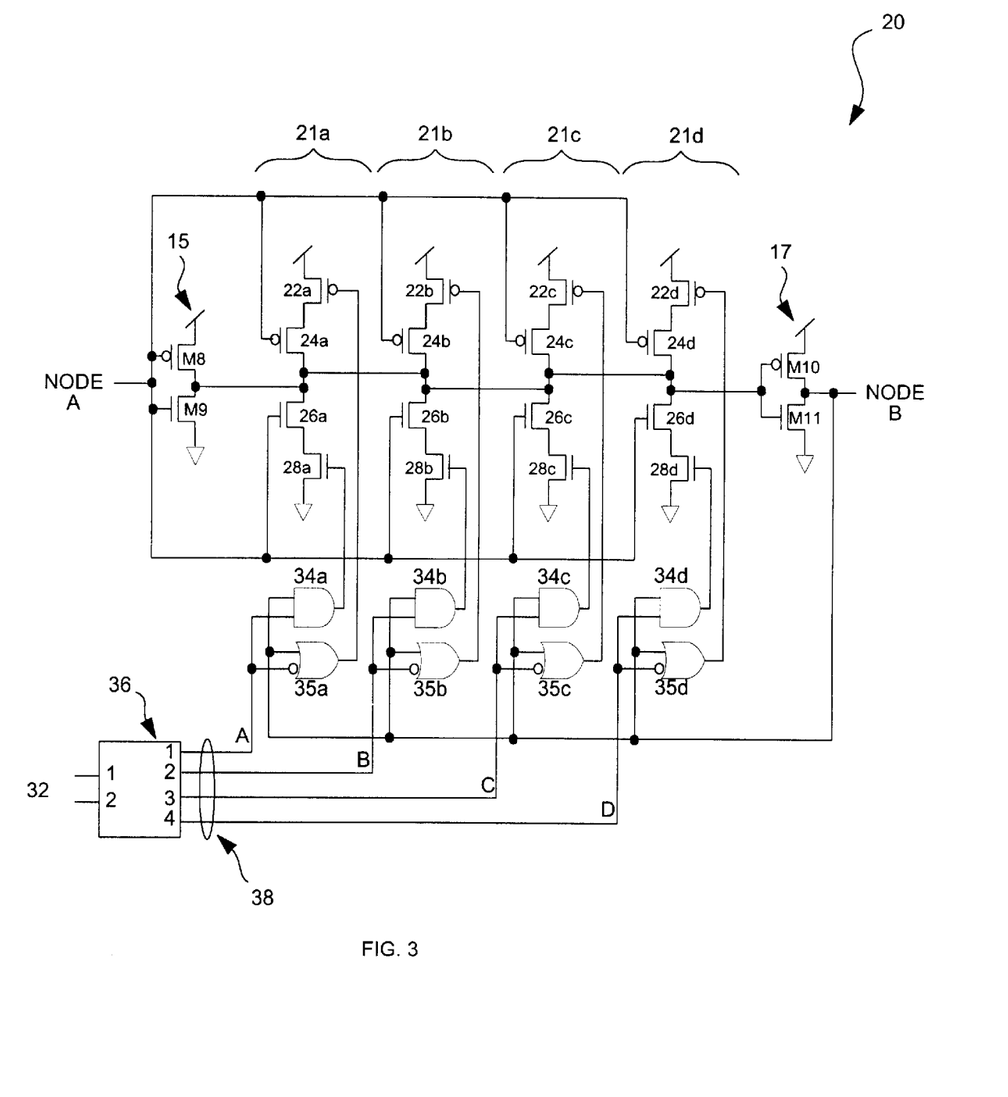
FIG. 3 illustrates a schematic diagram of a programmable Schmitt-trigger buffer.

FIG. 3 illustrates a schematic diagram of the Schmitt-trigger buffer 20 which includes four transistor cells 21A–D, an input inverter 15 (NMOS transistor M8 and PMOS transistor M9 whose gates are coupled in parallel at NODE A), an output inverter 17 (NMOS transistor M10 and PMOS transistor M11 whose gates are coupled in parallel at NODE B) and four sets of AND logic gates 34A–D and OR logic gates 35A–D, which are coupled to the logic lines 38A–D of the logic decoder 36. Each transistor cell 21A–D includes four pull-up and pull-down NMOS and PMOS transistors. It will be appreciated that the pull-up and pull-down transistors may individually have the same or different sizes.

The value (high or low) of an input signal $V_{in}$ at NODE A activates either the pull-up transistors 24A–D or the pull-down transistors 26A–D. The output signal $V_{out}$ at NODE B is fed back through the inputs to the AND logic gates 34A–D and the OR logic gates 35A–D along with the states of the logic lines 38A–D. In the exemplary embodiment, the states of the logic lines 38A–D are inverted at the input to the OR logic gates 35A–D. Also, the output of the logic gates 34A–D and 35A–D enable the operation of which of the transistors cells 21A–D are selected by the state of the logic lines 38A–D.

In the exemplary embodiment, the two control lines 32 enable the selection of four different sets of high and low trip points that correspond to the programmable hysteresis of the Schmitt-trigger buffer 20. The physical sizes of the pull-down transistors 26A–D are larger than the sizes of the respective pull-down transistors 28A–D, i.e., transistors 26A–D operate as switches. The low trip point of the Schmitt-trigger buffer 20 is determined by the imbalance in the overall sizing ratio caused by the pull-down transistors 28A–D that are enabled.

Similarly, the physical sizes of the pull-up transistors 24A–D are larger than the sizes of the respective pull-up transistors 22A–D; transistors 24A–D act as switches. Also, the high trip point of the Schmitt-trigger buffer 20 is determined by the overall sizing ratio imbalance caused by each of the pull-up transistors 22A–D that are enabled. as compared to the smaller sizes of the pull-down transistors 26A–D that are enabled.

In the exemplary embodiment, four different imbalanced overall sizing ratios can be selected by the state of the two control lines 32 which effect the hysteresis of the Schmitt-trigger buffer 20 and create four different sets of high and low trip points for the buffer.

Figure 4:
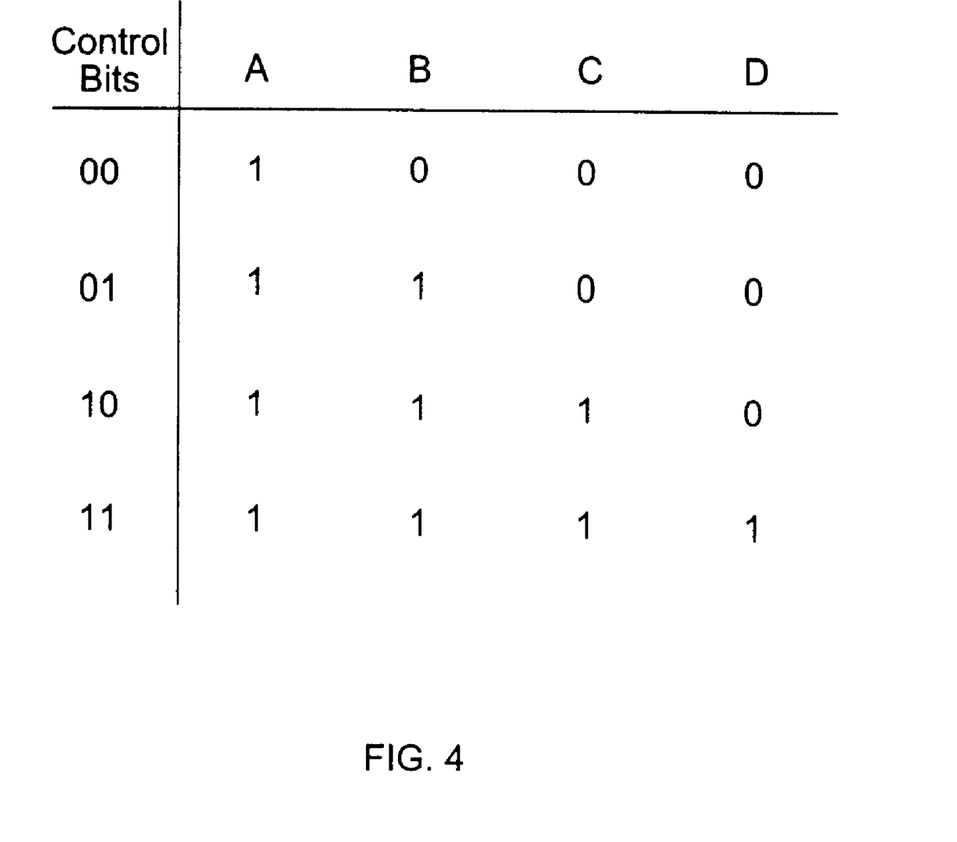
FIG. 4 shows a truth table of the output of a 2-to-4 bit logic decoder used in a programmable adaptive output driver.

FIG. 4 illustrates a state table for a 2-to-4 bit logic decoder for separately enabling four transistor cells with two control bits. The particular states of the two control bits produces four separate logic output states for enabling each of the transistor cells. It will be appreciated that the four logic output states of the logic decoder may be changed after an IC is manufactured to adjust the high and low trip points (hysteresis) of a programmable 2–4 bit Schmitt-trigger buffer that is included in an adaptive output driver.

Figure 5:
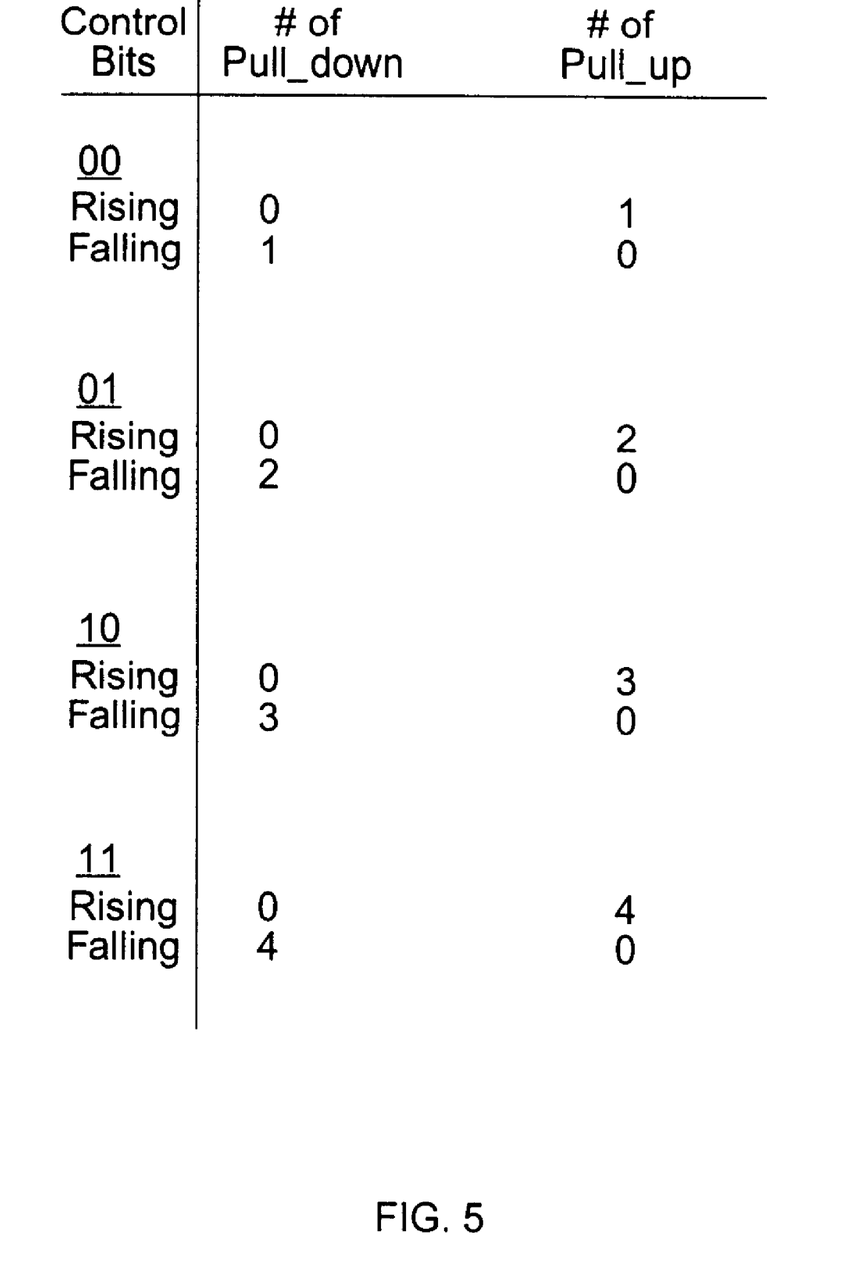
FIG. 5 illustrates a state table illustrating the sizing ratios of pull-up and large pull-down transistors when a 2-to-4 bit logic decoder is used in a programmable adaptive output driver.

FIG. 5 shows a state table illustrating enabled ("1") and disabled ("0") pull-up and pull-down transistors for a Schmitt-trigger buffer that are controlled by the state of two control bits for a 2–4 bit logic decoder. The number of the enabled pull-up and pull-down transistors associated with the rising and falling edge of the input signal is related to the number (four) of the decoder's logic outputs that are activated by the state of the control bits. As discussed above, a change in the overall sizing ratios of the transistors associated with both the rising and falling edge of the input signal is employed to change the high and low trip points for triggering the operation of the Schmitt-trigger buffer that disables/enables the secondary driver in an adaptive output driver. Additionally, the sizing ratio associated with the rising edge of an input signal is employed to determine the high trip point for triggering the output of the programmable Schmitt-trigger buffer; and the sizing ratio associated with the falling edge of the input signal is used to determine the low trip point for the buffer.

Figure 6:
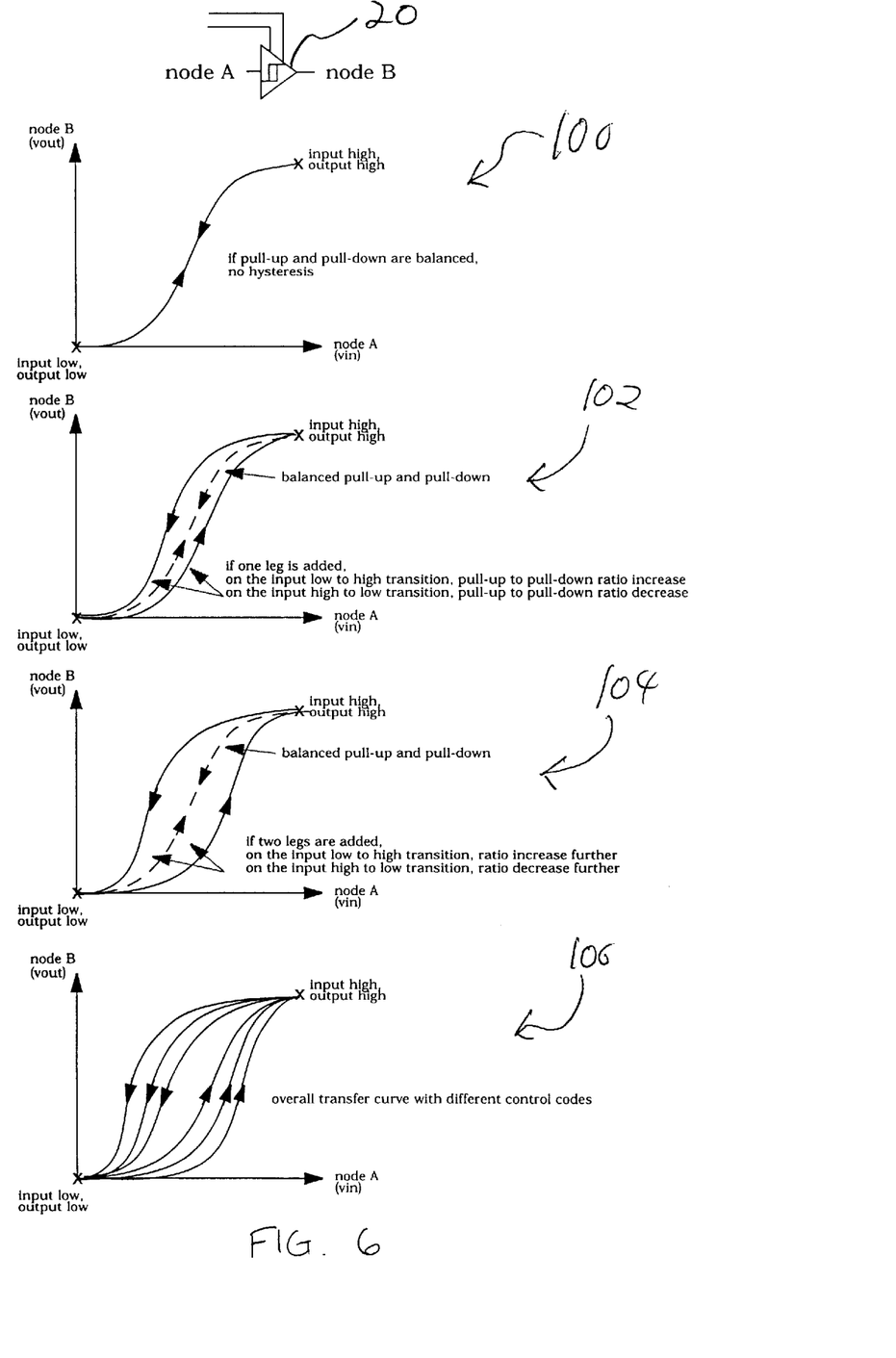
FIG. 6 shows graphs that illustrate the effect on the hysteresis of a Schmitt-trigger buffer caused by a change in the ratio of pull-up and pull-down transistors.

FIG. 6 illustrates a set of four graphs showing the effect on the hysteresis relationship between $V_{in}$ and $V_{out}$ for a programmable Schmitt-trigger buffer when the sizing ratio is balanced and unbalanced by up to three transistor cells. These graphs illustrate how the hysteresis of a programmable Schmitt-trigger buffer is increased depending upon the number of transistor cells that unbalance the overall sizing ratio of enabled transistors in the buffer. These graphs also show the relationship between the hysteresis of the Schmitt-trigger buffer and the buffer's high and low trip points.

At the top of FIG. 6, a graph 100 shows that there is substantially no hysteresis when the overall sizing ratio of enabled pull-up to pull-down transistors within a programmable Schmitt-trigger buffer is balanced. At the second highest position in FIG. 6, a graph 102 illustrates the hysteresis of the Schmitt-trigger buffer when the overall sizing ratio of enabled pull-up to pull-down transistors is unbalanced by one transistor cell. In this case, when one transistor cell is enabled and the input signal transitions from a low to high value, the ratio of pull-up to pull-down transistors is increased. Also, when the input signal causes a high to low transition, the ratio of pull-down to pull-up transistors increases.

Similarly, at the next to bottom position and bottom position of FIG. 6, a graph 104 and a graph 106 illustrate the respective effects on the hysteresis of a Schmitt-trigger buffer when the overall sizing ratio of enabled pull-up and pull-down transistors is off by two and three transistor cells. As more transistor cells are enabled, the imbalance in the overall sizing ratio increases which creates greater hysteresis for the Schmitt-trigger buffer.

Figure 7:
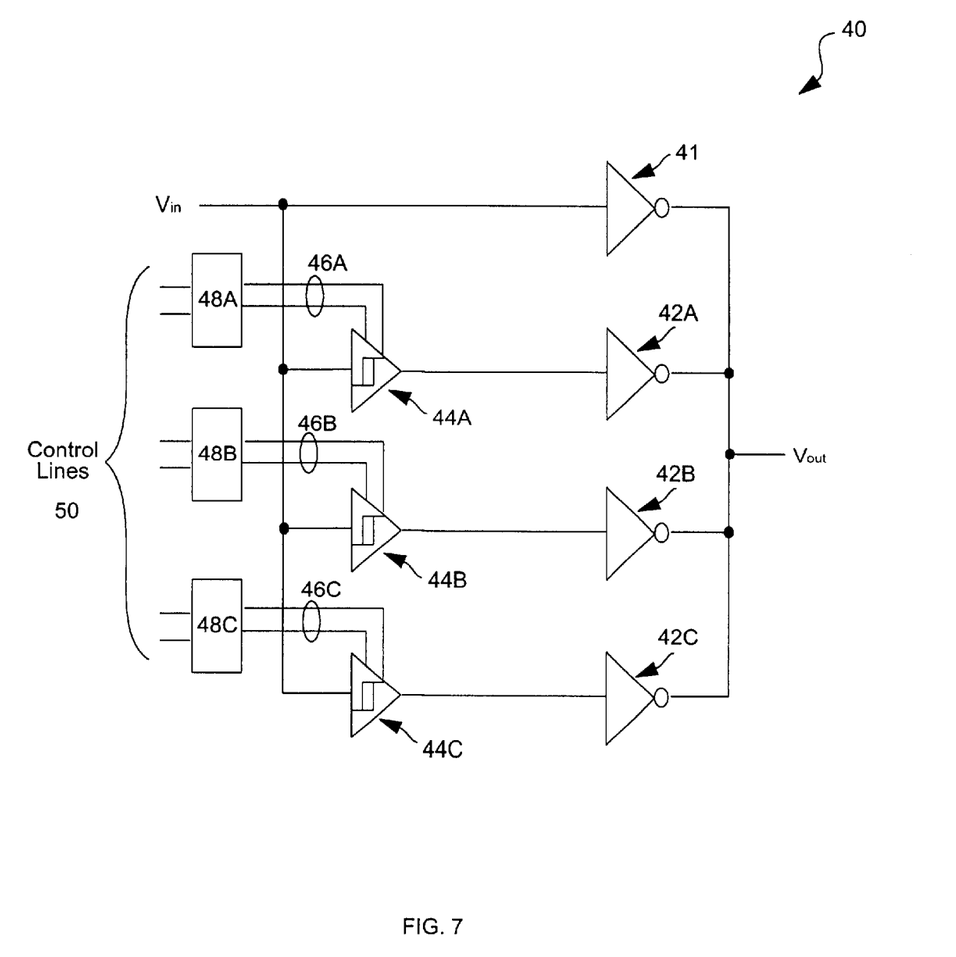
FIG. 7 illustrates a block diagram of programmable Schmitt-trigger buffers employed in a distributed and weighted output driver.

FIG. 7 illustrates a block diagram of in a distributed and weighted driver 40 that includes three programmable Schmitt-trigger buffers 44A–C for activating different stages at different times to reduce noise and power consumption. Three logic decoders 48A–C are controlled by control lines 50 and the decoders are coupled to logic output lines 46A–C that enable the operation of three Schmitt-trigger buffers 44A–C. An inverter 41 is coupled between the input and output of the distributed and weighted driver 40.

In the distributed and weighted driver 40, the programmable Schmitt-trigger buffers are employed as delay circuitry between the activation of each driver stage. By enabling different numbers of transistor cells in each of the programmable Schmitt-trigger buffers 44A–C, different delays can be programmed for each stage of the driver 40. Also, the outputs of the three Schmitt-trigger buffers 44A–C are coupled to the inputs of inverters 42A–C, respectively. The output of the driver 40 is presented at the output of the inverters 41 and 42A–C.

Figure 8:
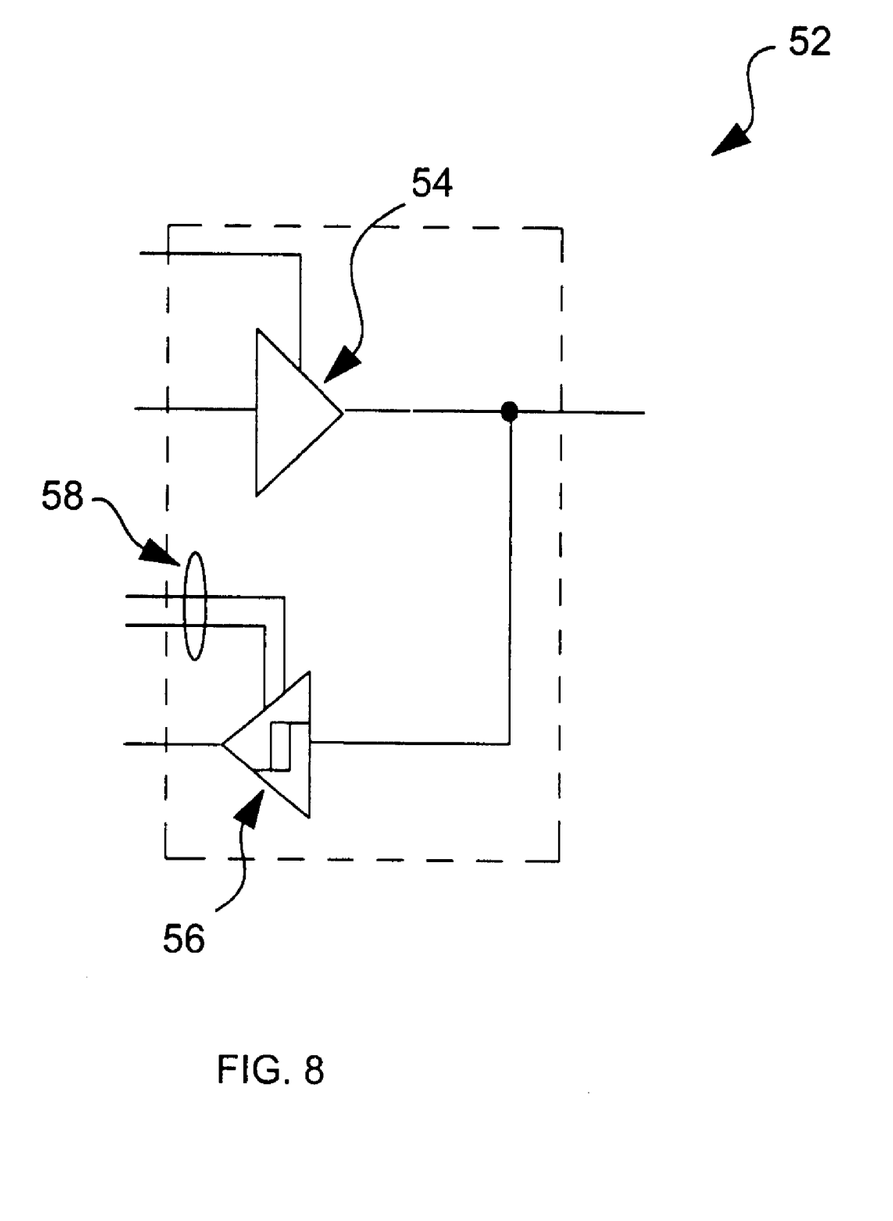
FIG. 8 shows a schematic diagram of a programmable Schmitt-trigger buffer used on the input side of an input/output driver cell, in accordance with the present invention.

FIG. 8 is a schematic diagram for a programmable Schmitt-trigger buffer 56 used on the input side of an input/output (I/O) driver 52 that can be employed with an integrated circuit, e.g., a microprocessor. The control lines 58 are used to alter the overall sizing ratio of pull-up and pull-down transistors in the Schmitt-trigger buffer so that the buffer's hysteresis and high and low trip points can be adjusted to meet actual operating conditions after the microprocessor is manufactured. In one embodiment, a tristate driver 54 is used on the output side of the I/O driver 52.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for programming the strength of an output signal driving a load, comprising:
   (a) an adaptive output driver that includes a primary driver and a secondary driver, the primary driver provides a primary current for driving the output signal into the load;
   (b) a control circuit that enables the secondary driver to assist the primary driver, the enabled secondary driver provides an additional current that is added to the primary current to drive the output signal into the load when transition times between high and low states for the output signal are slower than a maximum slew rate; and
   (c) a buffer for disabling the operation of the secondary driver, wherein a trip point for the buffer to disable the secondary driver is programmable so that the total amount of current provided by the adaptive output driver to drive the output signal into the load is adjustable to suit different output signal conditions.

2. The apparatus of claim 1, wherein the buffer includes at least one cell, each cell includes at least two pull-up transistors and at least two pull-down transistors.

3. The apparatus of claim 2, further comprising hysteresis in the response of the buffer, the hysteresis is related to an imbalance in the sizing ratio of each pull-up transistor and each pull-down transistor in each enabled cell and the hysteresis defines a value for the trip point where the buffer disables the operation of the secondary driver.

4. The apparatus of claim 2, further comprising a logic circuit that is coupled to the buffer and provides for selectively enabling one or more cells so that a position for the buffer's trip point is adjustable for different output signal conditions.

5. The apparatus of claim 2, wherein the pull-up transistors and pull-down transistors are CMOS transistors.

6. The apparatus of claim 1, wherein the buffer is a Schmitt-trigger buffer.

7. The apparatus of claim 1, wherein the control circuit employs one transistor to negate a logical state for each logic gate included in the control circuit so that the response time for the control circuit is reduced.

8. The apparatus of claim 1, wherein the control circuit provides short circuit protection for the adaptive output driver.

9. The apparatus of claim 1, wherein the control circuit includes a feedback circuit to monitor the slew rate of the transitions between the high and low states of the output signal.

10. The apparatus of claim 1, wherein the trip point includes a low trip point for transitions from the high state to the low state of the output signal and a high trip point for transitions from the low state to the high state of the output signal.

11. An apparatus for providing a delay in driving an input signal for an input stage of an input/output driver, comprising:
   (a) a tri-state buffer for an output stage of the input/output driver, the tri-state buffer providing a current to drive an output signal into an output load;
   (b) a Schmitt-trigger buffer in the input stage that provides a programmable delay in driving the input signal; and
   (c) a logic circuit operatively coupled to the Schmitt-trigger buffer, the logic circuit enables the separate programming of the Schmitt-trigger buffer's delay so that the operation of the input stage of the input/output driver is adjustable for different input signal conditions.

12. The apparatus of claim 11, wherein the input/output driver is employed with an integrated circuit, including a microprocessor.

13. A method for programming the strength of an output signal driving a load, comprising:
(a) providing a primary current for driving the output signal into the load;
(b) providing a secondary current that is added to the primary current when transition times between high and low states for the output signal are slower than a maximum slew rate; and
(c) disabling the secondary current with a buffer, wherein a trip point for the buffer to disable the secondary driver is programmable so that the total amount of current provided by the output driver to drive the output signal into the load is adaptable to different output signal conditions.

14. The method of claim 13, further comprising selectively enabling pull-down transistors and pull-up transistors so that a position of the buffer's trip point is adjustable for different output signal conditions.

15. The method of claim 13, further comprising providing short circuit protection when driving the output signal into the load.

16. The method of claim 13, further comprising monitoring output signal feedback to determine the slew rate of the transitions between the high and low states of the output signal.

17. The method of claim 13, further comprising employing hysteresis of the buffer to define a position for the trip point where the buffer disables the secondary current.

18. An apparatus for programming the strength of an output signal driving a load, comprising:
(a) means for providing a primary driver and a secondary driver, the primary driver providing current for driving the output signal into the load;
(b) means for enabling the secondary driver to assist the primary driver, the enabled secondary driver provides an additional current that is added to the current provided by the primary driver to drive the output signal into the load when transition times between high and low states for the output signal are slower than a maximum slew rate; and
(c) means for enabling a buffer to disable the operation of the secondary driver to assist the primary driver to drive the output signal into the load, wherein the buffer's trip point for disabling the secondary driver is programmable so that the total amount of current provided by the output driver to drive the output signal into the load is adaptable to different loading conditions.

* * * * *